(12) United States Patent
Zhao et al.

(10) Patent No.: US 12,157,679 B2
(45) Date of Patent: Dec. 3, 2024

(54) SINGLE-CRYSTAL-TYPE MULTI-ELEMENT POSITIVE ELECTRODE MATERIAL, AND PREPARATION METHOD THEREFOR AND APPLICATION THEREOF

(71) Applicant: BEIJING EASPRING MATERIAL TECHNOLOGY CO., LTD., Beijing (CN)

(72) Inventors: Tianmeng Zhao, Beijing (CN); Shunlin Song, Beijing (CN); Yafei Liu, Beijing (CN); Yanbin Chen, Beijing (CN)

(73) Assignee: Beijing Easpring Material Technology Co., Ltd., Beijing (CN)

( * ) Notice: Subject to any disclaimer, the term of this patent is extended or adjusted under 35 U.S.C. 154(b) by 0 days.

(21) Appl. No.: 18/091,977

(22) Filed: Dec. 30, 2022

(65) Prior Publication Data

US 2023/0202866 A1    Jun. 29, 2023

Related U.S. Application Data (63) Continuation of application No. PCT/CN2022/091942, filed on May 10, 2022.

(30) Foreign Application Priority Data

Dec. 24, 2021    (CN) .......................... 202111595596.0

(51) Int. Cl.
*C01G 53/00* (2006.01)
*H01M 10/0525* (2010.01)

(52) U.S. Cl.
CPC ........ *C01G 53/50* (2013.01); *H01M 10/0525* (2013.01); *C01P 2004/03* (2013.01); *C01P 2006/40* (2013.01)

(58) Field of Classification Search
None
See application file for complete search history.

(56) References Cited

U.S. PATENT DOCUMENTS

| | | | |
|---|---|---|---|
| 2011/0291044 A1 | 12/2011 | Wang et al. | |
| 2016/0293952 A1* | 10/2016 | Kaneda | H01M 4/505 |
| 2018/0226639 A1 | 8/2018 | Chu et al. | |
| 2020/0144618 A1 | 5/2020 | Lee et al. | |
| 2021/0143423 A1* | 5/2021 | Paulsen | C01G 53/50 |
| 2022/0102718 A1* | 3/2022 | Oshita | H01M 4/131 |
| 2023/0082796 A1 | 3/2023 | Lee et al. | |

FOREIGN PATENT DOCUMENTS

| | | |
|---|---|---|
| CN | 101621125 A | 1/2010 |
| CN | 102683667 A | 9/2012 |
| CN | 104134791 A | 11/2014 |
| CN | 105633395 A | 6/2016 |
| CN | 106505193 A | 3/2017 |
| CN | 108923041 A | 11/2018 |

(Continued)

OTHER PUBLICATIONS

Extended European Search Report issued on Nov. 14, 2023 for European Patent Application No. 22779188.6.

*Primary Examiner* — Nathanael T Zemui (74) *Attorney, Agent, or Firm* — Volpe Koenig (57) ABSTRACT

A single-crystal-type multi-element positive electrode material, and a preparation method therefor and an application thereof.

10 Claims, 4 Drawing Sheets

(56) References Cited

FOREIGN PATENT DOCUMENTS

| | | | |
|---|---|---|---|
| CN | 112599763 | A | 4/2021 |
| CN | 112750999 | A | 5/2021 |
| EP | 4095946 | A1 | 11/2022 |
| EP | 4144703 | A1 | 3/2023 |
| JP | 2023036062 | A | 3/2023 |
| WO | 2021/238202 | A1 | 12/2021 |

\* cited by examiner

SINGLE-CRYSTAL-TYPE MULTI-ELEMENT POSITIVE ELECTRODE MATERIAL, AND PREPARATION METHOD THEREFOR AND APPLICATION THEREOF

CROSS REFERENCE TO RELATED APPLICATIONS

This application is a 35 USC § 371 National Stage application of International Patent Application No. PCT/CN2022/091942, which was filed May 10, 2022, entitled "SINGLE-CRYSTAL-TYPE MULTI-ELEMENT POSITIVE ELECTRODE MATERIAL, AND PREPARATION METHOD THEREFOR AND APPLICATION THEREOF" and claims priority to Chinese Patent Application 202111595596.0, filed on Dec. 24, 2021, the contents of which are incorporated herein by reference as if fully set forth.

TECHNICAL FIELD

The present disclosure relates to the technical field of lithium ion batteries, in particular to a single-crystal multiple cathode material, and a preparation method therefor and a use thereof.

BACKGROUND ART

Energy and environmental problems have always been hotspots in today's society. As the market for new energy vehicles in China expands, the demand for powered lithium ion batteries has risen dramatically, and the rapid development of industries such as cell phones, cameras, electric vehicles, and power tools also makes the demand for lithium ion batteries growing. Therefore, the lithium ion battery industry has a good development prospect.

Lithium ion batteries have advantages such as high energy density, zero pollution, zero emission, and small size, cathode materials as major components of the lithium ion batteries, play a decisive role in the battery capacity, performance, and cost, and ternary materials have been widely studied in recent years and have developed rapidly because of their high energy density, long cycle stability, and cost-effective performance.

Ternary cathode materials for the lithium ion batteries are mainly composed of Ni/Co/Mn, and has high Ni content and high material capacity density, but increased nickel content leads to poor cycle life and safety of the materials, mainly due to lithium-nickel disordered arrangement, multiple phase transitions, a reaction of the cathode material with an electrolyte, and the like. Designing the material into a more stable single-crystal structure may improve the cyclic stability and thermal stability of the material, the quality of the single-crystal structure directly affects the electrochemical properties of the material, and a product having a rounded single-crystal morphology, a uniform particle size, less agglomeration and less adhesion enables the material to be higher in compaction density during electrode manufacture and less prone to crushing and shedding during cycling, thereby improving the energy density and cyclic stability of the material.

In order to obtain ternary single-crystal cathode materials with a stable structure, a synthesis process needs to be optimized, and by optimizing a sintering process and a doping and coating system, lattice defects can be reduced and the surface structure of the material can be stabilized, thereby improving the stability of the material and improving the battery performance while ensuring the high capacity of the material.

SUMMARY OF THE INVENTION

The present disclosure aims to solve the problems of non-uniform particle size, easy adhesion between particles, poor roundness of single-crystal and high agglomeration rate of single-crystal multiple cathode materials existing in the prior art, and provides a single-crystal multiple cathode material, and a preparation method therefor and a use thereof. The single-crystal multiple cathode material has rounded morphology, a uniform particle size, less agglomeration, and less adhesion, and has the characteristics of a high compaction density and good structural stability, and when the single-crystal multiple cathode material is applied to a lithium ion battery, the energy density, rate capability, cyclic stability and safety of the lithium ion battery can be significantly improved.

In order to achieve the above object, in a first aspect, the present disclosure provides a single-crystal multiple cathode material satisfying the following conditions:
- (1) single-crystal sizes $D_{PS90}$, $D_{PS10}$ and $D_{PS50}$ of the cathode material, which are measured by SEM, satisfying the following relationship: $0.1 \leq B_{90} = (D_{PS90} - D_{PS10})/D_{PS50} \leq 1.5$; and
- (2) an agglomeration rate of the cathode material is less than or equal to 20%;

wherein $D_{PS90}$ represents that 90% of the single-crystal size of the cathode material is less than $D_{PS90}$; $D_{PS50}$ represents that 50% of the single-crystal size of the cathode material is less than $D_{PS50}$; and $D_{PS10}$ represents that 10% of the single-crystal size of the cathode material is less than $D_{PS10}$.

In a second aspect, the present disclosure provides a method for preparing a single-crystal multiple cathode material comprising:
- S1. mixing a nickel cobalt manganese hydroxide precursor, a lithium source, and optionally a dopant D to obtain a mixture I;
- S2. subjecting a first high-temperature sintering on the mixture I in an oxygen or air atmosphere to obtain a cathode material process product I;
- S3. subjecting a second high-temperature sintering on the cathode material process product I in an oxygen or air atmosphere to obtain a cathode material process product II;
- S4. mixing the cathode material process product II with optionally a coating agent E to obtain a mixture II; and
- S5. subjecting a third high-temperature sintering on the mixture II in an oxygen or air atmosphere to obtain the single-crystal multiple cathode material.

In a third aspect, the present disclosure provides a single-crystal multiple cathode material prepared by the method described above.

In a fourth aspect, the present disclosure provides a application of the above single-crystal multiple cathode material in a lithium ion battery.

Through the above technical solutions, the single-crystal multiple cathode material, and the preparation method therefor and the use thereof provided by the present disclosure obtain the following beneficial effects:
- the single-crystal multiple cathode material provided by the present disclosure has rounded morphology, a uniform particle size, less agglomeration, and less adhesion, and has the characteristics of a high compaction density and good structural stability, and when the single-crystal multiple cathode material is applied to a lithium ion battery, the energy density, rate capability, cyclic stability and safety of the lithium ion battery can be significantly improved.

In the method for preparing the single-crystal multiple cathode material provided by the present disclosure, a mixture of the nickel cobalt manganese hydroxide precursor and a lithium salt is subjected to secondary high-temperature sintering. The secondary high-temperature sintering can allow a fully lithiated cathode material process product to easily form a single-crystal with better single-crystallization of the material. In addition, after the first high-temperature sintering, lithium enters the material, residual lithium on the surface is less, adhesion between particles is less, and a single-crystal material with good independence, few internal defects, and uniform size distribution is easily formed.

Further, in the method for preparing the single-crystal multiple cathode material provided by the present disclosure, during the first high-temperature sintering, water or carbon dioxide can be discharged to reduce the weight and size of the material, and during the second high-temperature sintering, reactants are recharged to a reaction vessel, more reactants can be charged, and the yield and production efficiency of the material can be improved. In addition, the mixture I can react completely in a shorter time during the first high-temperature sintering, and after the first high-temperature sintering, a single-crystal is easier to form in the second high-temperature sintering, and the single-crystallization time can be shortened, and thus, the yield and production efficiency can be improved without increasing the reaction time.

Further, in the method for preparing the single-crystal multiple cathode material provided by the present disclosure, the dopant D has the function of fluxing, and the introduction of the dopant D can reduce the temperature of the second high-temperature sintering, thereby saving energy, and can increase the degree of single-crystallization of the material, so that the single-crystal material is more rounded. The high particle sphericity, uniform particle size distribution, and low agglomeration rate make a battery electrode manufactured from the single-crystal cathode material have a high compaction density and more stable during battery operation and less prone to fall off, thereby improving the cyclic stability of the material.

Further, in the method for preparing the single-crystal multiple cathode material provided by the present disclosure, the cathode material process product II obtained after the second high-temperature sintering is mixed with the coating agent, the third high-temperature sintering is performed to obtain a coated single-crystal cathode material, and after high-temperature sintering, the coating agent can enter the crystal to a certain extent and form a gradient on the surface of the material to stabilize the structure of the material; at the same time, the coating can react with the residual lithium on the surface at a high temperature, reducing the residual lithium on the surface, and reducing side reactions; and high-temperature sintering also repairs defects inside the single-crystal, making the structure of the material more stable.

DETAILED DESCRIPTION OF THE EMBODIMENTS

The endpoints and any values of the ranges disclosed herein are not limited to the precise range or value, and these ranges or values should be understood as including values close to these ranges or values. For numerical ranges, the endpoint values of each range, the endpoint values of each range and individual point values, and individual point values may be combined with each other to obtain one or more new numerical ranges, and these numerical ranges should be considered to be specifically disclosed herein.

In a first aspect, the present disclosure provides a single-crystal multiple cathode material satisfying the following conditions:
(1) single-crystal sizes $D_{PS90}$, $D_{PS10}$ and $D_{PS50}$ of the cathode material, which are measured by SEM, satisfying the following relationship: $0.1 \leq B_{90} = (D_{PS90} - D_{PS10})/D_{PS50} \leq 1.5$; and
(2) an agglomeration rate of the cathode material is less than or equal to 20%;
wherein $D_{PS90}$ represents that 90% of the single-crystal size of the cathode material is less than $D_{PS90}$, $D_{PS50}$ represents that 50% of the single-crystal size of the cathode material is less than $D_{PS50}$; and $D_{PS10}$ represents that 10% of the single-crystal size of the cathode material is less than $D_{PS10}$.

In the present disclosure, the cathode material satisfying the above conditions has rounded morphology, a uniform particle size, less agglomeration, and less adhesion, and has the characteristics of a high compaction density and good structural stability, and when the single-crystal multiple cathode material is applied to a lithium ion battery, the energy density, rate capability, cyclic stability and safety of the lithium ion battery can be significantly improved.

In the present disclosure, the cathode material consists of single-crystalline particles.

In the present disclosure, $D_{PS}$ represents a single-crystal size obtained on the basis of a scale in an SEM image of the cathode material, and $D_{PS}$ of a single particle is an average of the longest diagonal and the shortest diagonal of the particle. The $D_{PS90}$, $D_{PS10}$, $D_{PS50}$, $B_{90}$, and $H_{PS}$ of the particles of the cathode material are statistical results obtained by randomly selecting 300 single-crystal particles as a sample from the SEM image. SEM test requires random sampling of the cathode material, and random selection of regions, and an SEM image obtained from the test can represent an average level of the cathode material. The diagonal value of the major and minor axis of the single-crystal can be obtained by any graph analysis software or manual measurements, and the data statistics $D_{PS90}$, $D_{PS10}$, $D_{PS50}$, $B_{90}$ and $H_{PS}$ can be obtained by any statistical software.

In the present disclosure, the agglomeration rate refers to a proportion of four or more adhered single-crystal particles in the total single-crystal particles in the SEM image of the cathode material.

Further, the single-crystal sizes $D_{PS90}$, $D_{PS10}$ and $D_{PS50}$ of the cathode material, which are measured by SEM, satisfy the following relationship: $0.1 \leq B_{90} = (D_{PS90} - D_{PS10})/D_{PS50} \leq 1.3$; preferably $0.1 \leq B_{90} = (D_{PS90} - D_{PS10})/D_{PS50} \leq 1.1$; more preferably $0.5 \leq B_{90} = (D_{PS90} - D_{PS10})/D_{PS50} \leq 1.3$; further preferably $0.7 \leq B_{90} = (D_{PS90} - D_{PS10})/D_{PS50} \leq 1.1$.

Further, the agglomeration rate of the cathode material is 15% or less, preferably 10% or less; more preferably 8% or less.

According to the present disclosure, the cathode material has an average single-crystal size (particle size) $D_{PS50}$ of 1-3 µm, preferably 1.2-2.8 µm, more preferably 1.5-2.5 µm.

According to the present disclosure, the cathode material satisfies the following conditions: $0.1 \leq H_{PS} \leq 0.5$;

where $H_{PS}$ is a statistical average of $H_{PSn}$ of a plurality of grain particles, $H_{PSn}$ is a calculated result of a single particle, $H_{PSn} = 2(D_{PSLn} - D_{PSSn})/(D_{PSLn} + D_{PSSn})$, $D_{PSLn}$ is the longest diagonal length of a single particle n of the cathode material, which is measured by SEM, and $D_{PSSn}$ is the shortest diagonal length of a single particle n of the cathode material, which is measured by SEM.

In the present disclosure, the cathode material satisfying the above conditions indicates that the cathode material has the characteristics of a uniform particle size, rounded morphology, less agglomeration, and less adhesion, which makes the cathode material have the advantages of a high compaction density and good structural stability, and when the cathode material is applied to a lithium ion battery, the energy density, rate capability, cyclic stability and safety of the lithium ion battery can be significantly improved.

Further, $0.1 \leq H_{PS} \leq 0.4$, more further $0.1 \leq H_{PS} \leq 0.3$.

According to the present disclosure, the cathode material has a $D_{50}$ of 2-5 µm, preferably 2-4 µm, more preferably 2.5-3.8 µm.

In the present disclosure, the $D_{50}$ of the cathode material is a result tested by a laser particle size analyzer.

According to the present disclosure, the cathode material has a composition represented by a formula I:

$$Li_{1+a}(A_mD_nNi_xMn_yCo_z)E_iO_2 \quad \text{Formula I}$$

wherein $-0.1 \leq a \leq 0.1$, $0 \leq m \leq 0.05$, $0 \leq n \leq 0.05$, $0.5 \leq x < 1$, $0 < y < 0.5$, $0 \leq z < 0.5$, and $0 \leq i \leq 0.05$; A is selected from at least one of V, Ta, Cr, La, Ce, Er and Y; D is selected from at least one of Mg, Sr, B, V, Al, Ca, Zn, Ba, Ra, Zr and Ti; and E is selected from at least one of Al, Nb, Co, Mn, Mo, W, Si, Mg, Ti and Zr.

Further, $0 \leq a \leq 0.08$, $0.001 \leq m \leq 0.03$, $0.001 \leq n \leq 0.03$, $0.7 \leq x < 0.9$, $0.1 < y < 0.3$, $0.1 \leq z < 0.3$, and $0.001 \leq i \leq 0.03$; A is selected from at least one of La, Ce, Er and Y; D is selected from at least one of Sr, B, V, Al and Ca; and E is selected from at least one of W, Si, Mg, Ti and Zr.

In the present disclosure, the single-crystal multiple cathode material has a compaction density PD of 3.3 g/cm³ or more, preferably 3.3-3.6 g/cm³.

In a method for preparing the single-crystal multiple cathode material of the present disclosure, a mixture of a precursor material and a lithium salt is subjected to twice high-temperature sintering processes.

The temperature of the second high-temperature sintering is 20-200° C. higher than the temperature of the first high-temperature sintering, ensuring that a cathode material process product I obtained after the first high-temperature sintering is sufficiently lithiated and a state of multicrystal is guaranteed.

In a second aspect, the present disclosure provides a method for preparing a single-crystal multiple cathode material comprising:

S1. mixing a nickel cobalt manganese hydroxide precursor, a lithium source, and optionally a dopant D to obtain a mixture I;

S2. subjecting a first high-temperature sintering on the mixture I in an oxygen or air atmosphere to obtain a cathode material process product I;

S3. subjecting a second high-temperature sintering on the cathode material process product I in an oxygen or air atmosphere to obtain a cathode material process product II;

S4. mixing the cathode material process product II with optionally a coating agent E to obtain a mixture II; and S5. subjecting a third high-temperature sintering on the mixture II in an oxygen or air atmosphere to obtain the single-crystal multiple cathode material.

In the present disclosure, a mixture of the nickel cobalt manganese hydroxide precursor and a lithium salt is subjected to a secondary high temperature sintering. The secondary high-temperature sintering can allow a fully lithiated cathode material process product to easily form a single-crystal with better single-crystallization of the material. In addition, after the first high-temperature sintering, lithium enters the material, residual lithium on the surface is less, adhesion between particles is less, and a single-crystalline material with good independence, few internal defects, and uniform size distribution is easily formed.

According to the present disclosure, in the step S1, the lithium source is selected from at least one of lithium carbonate, lithium nitrate, lithium hydroxide, lithium oxide and lithium acetate.

According to the present disclosure, the lithium source is added in a stoichiometric ratio of $0.9 \leq [n(Li)]/[n(Ni)+n(Co)+n(Mn)] \leq 1.1$.

In the present disclosure, when the addition amount of the lithium source satisfies the above requirement, the precursor can fully react with the lithium source, thereby making the prepared single-crystal multiple cathode material have more excellent performance.

Further, the lithium source is added in a stoichiometric ratio of $1 \leq [n(Li)]/[n(Ni)+n(Co)+n(Mn)] \leq 1.08$, preferably $1.02 \leq [n(Li)]/[n(Ni)+n(Co)+n(Mn)] \leq 1.06$.

In the present disclosure, the dopant D has a fluxing effect during the second high-temperature sintering, which can reduce the sintering temperature, save the cost, and a cathode material with better single-crystallization was obtained.

According to the present disclosure, the dopant D is selected from at least one of oxides, oxyhydroxides, hydroxides, carbonates and oxalates containing at least one element of Mg, Sr, B, V, Al, Ca, Zn, Ba, Ra, Zr and Ti. In particular, the dopant D is selected from at least one of vanadium oxide, strontium hydroxide, strontium carbonate, boric acid, calcium oxide, and barium oxide.

According to the present disclosure, the dopant D is added in a stoichiometric ratio of $0 \leq [n(D)]/[n(Ni)+n(Co)+n(Mn)] \leq 0.05$.

In the present disclosure, when the dopant D is used in an amount which satisfies the above range, the structure of the prepared cathode material can be stabilized.

Further, the dopant D is added in a stoichiometric ratio of $0.001 \leq [n(D)]/[n(Ni)+n(Co)+n(Mn)] \leq 0.03$.

According to the present disclosure, in the step S2, the conditions for the first high-temperature sintering include a sintering temperature of 700-1000° C. and a sintering time of 2-10 h.

In the present disclosure, the first high-temperature sintering of the mixture I under the above conditions can ensure sufficient lithiation of the cathode material, thus making the comprehensive performance of the prepared cathode material more excellent.

Further, in the step S2, the conditions for the first high-temperature sintering include a sintering temperature of 750-900° C., preferably 800-900° C.; and a sintering time of 3-10 h, preferably 5-10 h.

According to the present disclosure, the cathode material process product I has a $D_{50}$ of 2-5 μm.

In the present disclosure, the cathode material process product I is sufficiently lithiated multi-crystal composed of primary particles. In particular, when $D_{50}$ of the cathode material process product I satisfies the above range, the cathode material thus prepared has an appropriate size, a high compaction density, and a stable structure, and can maintain a high capacity.

Further, the cathode material process product I has a $D_{50}$ of 2-4.5 μm, preferably 2-4 μm.

According to the present disclosure, in the step S3, the conditions for the second high-temperature sintering include a sintering temperature of 720-1200° C. and a sintering time of 5-20 h.

In the present disclosure, the second high-temperature sintering of the cathode material process product I under the above conditions enables the prepared cathode material to have an appropriate single-crystal size, and the particle size of the cathode material to be uniform and the sphericity to be good.

In the present disclosure, preferably, the second high-temperature sintering is performed after crushing the cathode material process product I.

Further, in the step S3, the conditions for the second high-temperature sintering include a sintering temperature of 850-1150° C., preferably 800-1100° C.; and a sintering time of 8-20 h, preferably 10-18 h.

According to the present disclosure, the temperature of the second high-temperature sintering is higher than the temperature of the first high-temperature sintering, preferably 20-200° C. higher; more preferably 30-100° C. higher, further preferably 40-60° C. higher.

In the present disclosure, by controlling the temperature of the second high-temperature sintering to be 20-200° C. higher than the temperature of the first high-temperature sintering, it can be ensured that the cathode material process product I obtained after the first high-temperature sintering is sufficiently lithiated and a state of multicrystal is guaranteed, and if the temperature of the first high-temperature sintering is too low, sufficient lithiation cannot be achieved, and if the temperature of the first high-temperature sintering is too high, the cathode material process product I becomes a single-crystal structure.

According to the present disclosure, the cathode material process product II has a $D_{50}$ of 2-5 μm, preferably 2-4 μm.

According to the present disclosure, in the step S4, the coating agent E is selected from at least one of oxides, oxyhydroxides, hydroxides, carbonates and oxalates containing at least one element of Al, Nb, Co, Mn, Mo, W, Si, Mg, Ti and Zr. In particular, the coating agent E is selected from at least one of magnesium oxide, silicon oxide, tungsten oxide, and zirconium oxide.

According to the present disclosure, the coating agent E is added in a stoichiometric ratio of $0 \leq [n(E)]/[n(Ni)+n(Co)+n(Mn)] \leq 0.05$.

Further, the coating agent E is added in a stoichiometric ratio of $0.001 \leq [n(E)]/[n(Ni)+n(Co)+n(Mn)] \leq 0.03$.

According to the present disclosure, in the step S5, the conditions for the third high-temperature sintering include a sintering temperature of 500-900° C. and a sintering time of 3-10 h.

In the present disclosure, the third high-temperature sintering of the mixture of the cathode material process product II and the coating agent E under the above conditions can modify the surface defects of the cathode material and play a role in stabilizing the crystal surface structure.

In the present disclosure, preferably, the third high-temperature sintering is performed after crushing the cathode material process product II and mixing the crushed cathode material process product II with the coating agent E.

Further, in the step S5, the conditions for the third high-temperature sintering include a sintering temperature of 600-900° C., preferably 700-800° C.; and a sintering time of 4-10 h, preferably 6-10 h.

In the present disclosure, the nickel cobalt manganese hydroxide precursor may be a precursor conventional in the art, preferably the nickel cobalt manganese hydroxide precursor is a hydroxide containing Ni, Co, Mn and a dopant A. Further, the nickel cobalt manganese hydroxide precursor is spherical or spheroidal single particles.

In one specific embodiment of the present disclosure, the method for preparing the nickel cobalt manganese hydroxide precursor comprising:
(1) preparing a mixed salt solution of a nickel salt, a cobalt salt, a manganese salt in a molar ratio of Ni:Co:Mn=x:z:y; and preparing a dopant A and a precipitant into a dopant A salt solution and a precipitant solution, respectively;
(2) under a nitrogen atmosphere, adding the mixed salt solution, the precipitant solution, ammonia water and optionally the dopant A salt solution into a reactor, carrying out a continuous reaction and aging to obtain a solid-liquid mixed slurry; and
(3) subjecting the solid-liquid mixed slurry to filter pressing, washing, and drying to obtain the nickel cobalt manganese hydroxide precursor.

In the present disclosure, the nickel salt, the cobalt salt and the manganese salt may be nickel salts, cobalt salts and manganese salts conventional in the art. In particular, the nickel salt is selected from nickel sulfate and/or nickel chloride; the cobalt salt is selected from cobalt sulfate and/or cobalt chloride; and the manganese salt is selected from manganese sulfate and/or manganese chloride.

In the present disclosure, the precipitant may be a precipitant conventional in the art, such as at least one of sodium hydroxide, potassium hydroxide, sodium carbonate, and ammonium carbonate. The complexing agent may be a complexing agent conventional in the art, for example ammonia water.

According to the present disclosure, the mixed salt solution has a concentration of 1-3 mol/L; the precipitant solution has a concentration of 5-10 mol/L; and the ammonia water has a mass concentration of 20-30 wt %.

According to the present disclosure, the dopant A is selected from soluble salts and/or sols containing at least one element of V, Ta, Cr, La, Ce, Er and Y. In particular, the dopant A is selected from one of erbium nitrate, yttrium sulfate, and lanthanum nitrate.

According to the present disclosure, the dopant A is added in a stoichiometric ratio of $0 \leq [n(A)]/[n(Ni)+n(Co)+n(Mn)] \leq 0.05$.

Further, the dopant A is added in a stoichiometric ratio of $0.001 \leq [n(A)]/[n(Ni)+n(Co)+n(Mn)] \leq 0.03$.

According to the present disclosure, the conditions for the continuous reaction include a pH of 11-13, a reaction temperature of 40-60° C. and a solution retention time of 6-30 h.

According to the present disclosure, the nickel cobalt manganese hydroxide precursor containing the dopant A has a $D_{50}$ of 2-6 μm, an apparent density of 0.6-1 g/cm³ and a tap density of 1.2-1.6 g/cm³.

Further, the nickel cobalt manganese hydroxide precursor containing the dopant A has a $D_{50}$ of 2.5-5.5 μm, an apparent density of 0.6-0.9 g/cm³ and a tap density of 1.2-1.55 g/cm³.

In a third aspect, the present disclosure provides a single-crystal multiple cathode material prepared by the preparation method described above.

According to the present disclosure, the cathode material satisfying the following conditions:
(1) single-crystal sizes $D_{PS90}$, $D_{PS10}$ and $D_{PS50}$ of the cathode material, which are measured by SEM, satisfying the following relationship: $0.1 \leq B_{90} = (D_{PS90} - D_{PS10})/D_{PS50} \leq 1.5$; and
(2) an agglomeration rate of the cathode material is less than or equal to 20%;
wherein $D_{PS90}$ represents that 90% of the single-crystal size of the cathode material is less than $D_{PS90}$; $D_{PS50}$ represents that 50% of the single-crystal size of the cathode material is less than $D_{PS50}$; and $D_{PS10}$ represents that 10% of the single-crystal size of the cathode material is less than $D_{PS10}$.

Further, the single-crystal sizes $D_{PS90}$, $D_{PS10}$ and $D_{PS50}$ of the cathode material, which are measured by SEM, satisfy the following relationship: $0.1 \leq B_{90} = (D_{PS90} - D_{PS10})/D_{PS50} \leq 1.3$; preferably, $0.1 \leq B_{90} = (D_{PS90} - D_{PS10})/D_{PS50} \leq 1.1$.

Further, the agglomeration rate of the cathode material is less than or equal to 15%, preferably less than or equal to 10%.

According to the present disclosure, the cathode material has an average single-crystal size $D_{PS50}$ of 1-3 μm.

Further, the cathode material has an average single-crystal size $D_{PS50}$ of 1.2-2.8 μm, preferably 1.5-2.5 μm.

According to the present disclosure, the cathode material satisfying the following conditions: $0.1 \leq H_{PS} \leq 0.5$;
where $H_{PS}$ is a statistical average of $H_{PSn}$ of a plurality of grain particles, $H_{PSn}$ is a calculated result of a single particle, $H_{PSn} = 2(D_{PSLn} - D_{PSSn})/(D_{PSLn} + D_{PSSn})$, $D_{PSLn}$ is the longest diagonal length of a single particle n of the cathode material, which is measured by SEM, and $D_{PSSn}$ is the shortest diagonal length of a single particle n of the cathode material, which is measured by SEM.

Further, $0.1 \leq H_{PS} \leq 0.4$, more further $0.1 \leq H_{PS} \leq 0.3$.

According to the present disclosure, the cathode material has a $D_{50}$ of 2-5 μm, preferably 2-4 μm, more preferably 2.5-3.8 μm.

According to the present disclosure, the cathode material has a composition represented by a formula I:

$$Li_{1+a}(A_mD_nNi_xMn_yCo_z)E_iO_2 \quad \text{Formula I}$$

wherein $-0.1 \leq a \leq 0.1$, $0 \leq m \leq 0.05$, $0 \leq n \leq 0.05$, $0.5 \leq x < 1$, $0 < y < 0.5$, $0 \leq z < 0.5$, and $0 \leq i \leq 0.05$; A is selected from at least one of V, Ta, Cr, La, Ce, Er and Y; D is selected from at least one of Mg, Sr, B, V, Al, Ca, Zn, Ba, Ra, Zr and Ti; and E is selected from at least one of Al, Nb, Co, Mn, Mo, W, Si, Mg, Ti and Zr.

Further, $0 \leq a \leq 0.08$, $0.001 \leq m \leq 0.03$, $0.001 \leq n \leq 0.03$, $0.7 \leq x < 0.9$, $0.1 < y < 0.3$, $0.1 \leq z < 0.3$, and $0.001 \leq i \leq 0.03$; A is selected from at least one of La, Ce, Er and Y; D is selected from at least one of Sr, B, V, Al and Ca; and E is selected from at least one of W, Si, Mg, Ti and Zr.

In the present disclosure, the single-crystal multiple cathode material has a compaction density PD of 3.3 g/cm³ or more, preferably 3.3-3.6 g/cm³.

In a fourth aspect, the present disclosure provides a use of the above single-crystal multiple cathode material in a lithium ion battery.

Hereinafter, the present disclosure will be described in detail by examples. In the following examples,
$D_{50}$ of the cathode material was a result tested by a laser particle size analyzer;
the single-crystal sizes of the cathode material were obtained by using an SEM scale as a reference;
the compaction density of the cathode material was measured by using a compaction density tester;
the apparent density and the tap density of the nickel cobalt manganese hydroxide precursor were respectively measured by using a tap density tester;
electrochemical performance of a button cell:
0.1 C first discharge specific capacity, 1.0 C discharge specific capacity, and capacity retention in 80 cycles at 1 C/1 C@45° C. under a voltage of 3.0-4.3 V; and
a cycling performance test was performed as follows: the high temperature capacity retention of the material was investigated by using the activated cell at a current density of 1 C in a voltage interval of 3.0-4.3 V at a temperature of 45° C. for 80 cycles.

Performance evaluation on the manufactured button cell was defined as follows:
a button cell was manufactured and placed for 2 h, and after an open circuit voltage was stabilized, a cathode was charged at a current density of 0.1 C to a cut-off voltage of 4.3 V, charged at a constant voltage for 30 min, and then discharged at the same current density to a cut-off voltage of 3.0 V; and charge and discharge were performed once in the same manner, and the cell at this time was used as the activated cell.

A cycling performance test was performed as follows: the high temperature capacity retention of the material was investigated by using the activated cell at a current density of 1 C in a voltage interval of 3.0-4.3 V at a temperature of 45° C. for 80 cycles.

Electrical performance test parameters were tested by Shenzhen NEWARE CT-3008 battery test system.

The content of $Li_2CO_3$ and LiOH was obtained by potentiometric titration.

The raw materials used in the examples as well as the comparative examples were commercially available.

Example 1

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=80:10:10, a 0.2 mol/L $La_2(SO_4)_3$ solution was prepared, a 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(La)=1:0.01 was controlled, a stirring speed was 200 rpm, the reaction temperature was maintained at 55° C., a pH was 12.3, and the parallel flow time was 23 h, and aging was performed for 20 h to obtain a solid-liquid mixed slurry.

(3) The solid-liquid mixed slurry was subjected to filter pressing, washed and dried at 120° C. for 5 h to obtain a nickel cobalt manganese hydroxide precursor P1 containing a dopant La and having a $D_{50}$ of 3.3 wherein the precursor is spherical or spheroidal single particles, and has a loose structure, an apparent density of 0.72 g/cm$^3$ and a tap density of 1.34 g/cm$^3$.

II: Preparation of Single-Crystal Multiple Cathode Material

S1. The nickel cobalt manganese hydroxide precursor P1, lithium hydroxide, and calcium oxide were uniformly mixed in a ratio of [n(Ni)+n(Co)+n(Mn)]:n(Li): n(Ca)=1:1.05:0.008 in a high-speed mixer to obtain a mixture I;

S2. the mixture I was subjected to a first high-temperature sintering at 850° C. for 8 h under an oxygen atmosphere, natural cooling to room temperature, and crushing and sieving to obtain a cathode material process product I having a $D_{50}$ of 3.2 μm;

S3. the cathode material process product I was subjected to a second high-temperature sintering at 900° C. for 8 h under an oxygen atmosphere, natural cooling to room temperature, and crushing and sieving to obtain a cathode material process product II having a $D_{50}$ of 3.2 μm, primary particles being independent of each other; wherein the temperature of the second high-temperature sintering is 50° C. higher than the temperature of the first high-temperature sintering;

S4. the cathode material process product II and magnesium oxide were uniformly mixed in a ratio of [n(Ni)+ n(Co)+n(Mn)]:n(Mg)=1:0.012 in a high-speed mixer to obtain a mixture II; and S5. the mixture II was subjected to a third high-temperature sintering at 750° C. for 10 h under an oxygen atmosphere, natural cooling to room temperature, and crushing and sieving to obtain a single-crystal multiple cathode material A1. Its composition was $Li_{1.05}(La_{0.01}Ca_{0.008}Ni_{0.8}Co_{0.1}Mn_{0.1})Mg_{0.012}O_2$. The performance parameters of the cathode material A1 are shown in Table 1.

Figure 1:
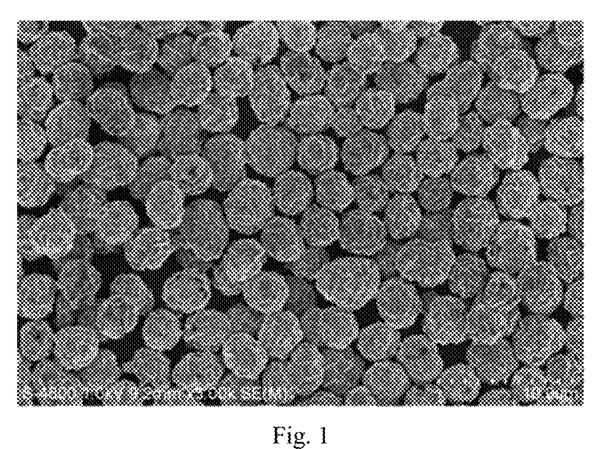
FIG. 1 is a SEM image of a cathode material process product I prepared in Example 1.
Figure 2:
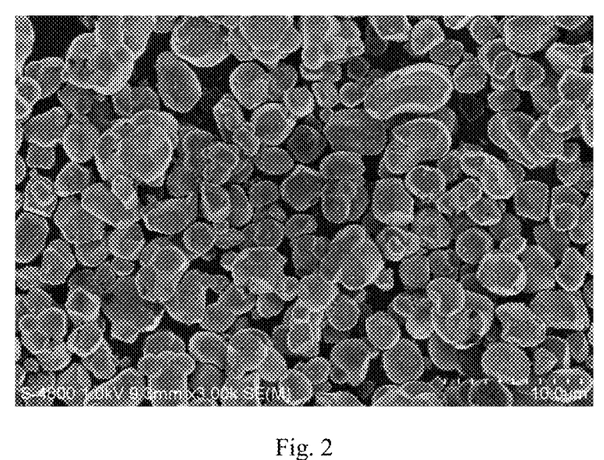
FIG. 2 is a SEM image of a cathode material process product II prepared in Example 1.
Figure 3:
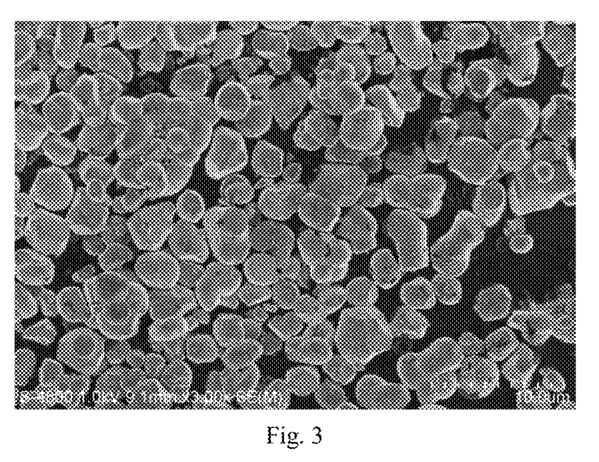
FIG. 3 is a SEM image of a single-crystal multiple cathode material prepared in Example 1.

FIG. 1 is a SEM image of the cathode material process product I prepared in Example 1; and as can be seen from FIG. 1, the cathode material process product I is a multi-crystal compound. FIG. 2 is a SEM image of the cathode material process product II prepared in Example 1; and as can be seen from FIG. 2, the cathode material process product II is a single-crystal compound. FIG. 3 is a SEM image of the single-crystal multiple cathode material A1; and as can be seen from FIG. 3, the cathode material A1 is a single-crystal compound with a surface coating layer.

Example 2

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=80:10:10, a 0.2 mol/L $Ce_2(SO_4)_3$ solution was prepared, a 8 mol/L KOH solution was prepared as a precipitant, and 25 wt % ammonia water was used directly as a complexing agent.

(2) Under nitrogen protection, the above solutions were introduced into a reactor in a parallel flow, wherein [n(Ni)+ n(Co)+n(Mn)]:n(Ce)=1:0.015 was controlled, a stirring speed was 200 rpm, the reaction temperature was maintained at 55° C., a pH was 12.3, and the parallel flow time was 20 h, and aging was performed for 20 h to obtain a solid-liquid mixed slurry.

(3) The solid-liquid mixed slurry was subjected to washed, filter pressing, and dried at 110° C. for 5.5 h to obtain a nickel cobalt manganese hydroxide precursor P2 containing a dopant Ce and having a $D_{50}$ of 4 μm, wherein the precursor is spherical or spheroidal single particles, and has a loose structure, an apparent density of 0.73 g/cm$^3$ and a tap density of 1.35 g/cm$^3$.

II: Preparation of Single-Crystal Multiple Cathode Material

S1. The nickel cobalt manganese hydroxide precursor, lithium hydroxide, and strontium oxide were uniformly mixed in a ratio of [n(Ni)+n(Co)+n(Mn)]:n(Li): n(Sr)=1:1.05:0.012 in a high-speed mixer to obtain a mixture I;

S2. the mixture I was subjected to a first high-temperature sintering at 840° C. for 4 h under an oxygen atmosphere, natural cooling to room temperature, and crushing and sieving to obtain a cathode material process product I having a $D_{50}$ of 3.1 μm;

S3. the cathode material process product I was subjected to a second high-temperature sintering at 900° C. for 5 h under an oxygen atmosphere, natural cooling to room temperature, and crushing and sieving to obtain a cathode material process product II having a $D_{50}$ of 3.0 primary particles being independent of each other; wherein the temperature of the second high-temperature sintering is 60° C. higher than the temperature of the first high-temperature sintering;

S4. the cathode material process product II and silicon oxide were uniformly mixed in a ratio of [n(Ni)+n (Co)+n(Mn)]:n(Si)=1:0.01 in a high-speed mixer to obtain a mixture II; and S5. the mixture II was subjected to a third high-temperature sintering at 720° C. for 10 h under an oxygen atmosphere, natural cooling to room temperature, and crushing and sieving to obtain a single-crystal multiple cathode material A2. Its composition was $Li_{1.05}(Ce_{0.015}Sr_{0.012}Ni_{0.8}Co_{0.1}Mn_{0.1})Si_{0.01}O_2$. The performance parameters of the cathode material A2 are shown in Table 1.

Example 3

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=80:10:10, a 0.2 mol/L $Er(NO_3)_3$ solution was prepared, a 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+ n(Co)+n(Mn)]:n(Er)=1:0.015 was controlled, a stirring speed was 200 rpm, the reaction temperature was maintained at 56° C., a pH was 12.4, and the parallel flow time was 24 h, and aging was performed for 20 h to obtain a solid-liquid mixed slurry.

(3) The solid-liquid mixed slurry was subjected to washed, filter pressing, and dried at 120° C. for 6 h to obtain a nickel cobalt manganese hydroxide precursor P3 containing a dopant Er and having a $D_{50}$ of 3.9 μm, wherein the precursor is spherical or spheroidal single particles, and has a loose structure, an apparent density of 0.71 g/cm³ and a tap density of 1.33 g/cm³.

II: Preparation of Single-Crystal Multiple Cathode Material

S1. The nickel cobalt manganese hydroxide precursor P3, lithium hydroxide, and boron oxide were uniformly mixed in a ratio of [n(Ni)+n(Co)+n(Mn)]:n(Li):n(B)=1:1.04:0.009 in a high-speed mixer to obtain a mixture I;

S2. the mixture I was subjected to a first high-temperature sintering at 860° C. for 10 h under an oxygen atmosphere, natural cooling to room temperature, and crushing and sieving to obtain a cathode material process product I having a $D_{50}$ of 3.8 μm;

S3. the cathode material process product I was subjected to a second high-temperature sintering at 900° C. for 15 h under an oxygen atmosphere, natural cooling to room temperature, and crushing and sieving to obtain a cathode material process product II having a $D_{50}$ of 3.7 μm, primary particles being independent of each other; wherein the temperature of the second high-temperature sintering is 40° C. higher than the temperature of the first high-temperature sintering;

S4. the cathode material process product II and tungsten oxide were uniformly mixed in a ratio of [n(Ni)+n(Co)+n(Mn)]:n(W)=1:0.01 in a high-speed mixer to obtain a mixture II; and S5. on the mixture II was subjected to a third high-temperature sintering at 780° C. for 6 h under an air atmosphere, natural cooling to room temperature, and crushing and sieving to obtain a single-crystal multiple cathode material A3. Its composition was $Li_{1.04}(Er_{0.015}B_{0.009}Ni_{0.8}Co_{0.1}Mn_{0.1})W_{0.01}O_2$. The performance parameters of the cathode material A3 are shown in Table 1.

Example 4

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=50:20:30, a 0.2 mol/L $Cr_2(SO_4)_3$ solution was prepared, a 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(Cr)=1:0.005 was controlled, a stirring speed was 200 rpm, the reaction temperature was maintained at 52° C., a pH was 12.3, and the parallel flow time was 19 h, and aging was performed for 20 h to obtain a solid-liquid mixed slurry.

(3) The solid-liquid mixed slurry was subjected to washed, filter pressing, and dried at 100° C. for 7 h to obtain a nickel cobalt manganese hydroxide precursor P4 containing a dopant Cr and having a $D_{50}$ of 4.1 μm, wherein the precursor is spherical or spheroidal single particles, and has a loose structure, an apparent density of 0.70 g/cm³ and a tap density of 1.31 g/cm³.

II: Preparation of Single-Crystal Multiple Cathode Material

S1. A nickel cobalt manganese hydroxide precursor P4, lithium carbonate and aluminum fluoride were uniformly mixed in a ratio of [n(Ni)+n(Co)+n(Mn)]:n(Li):n(Al)=1:1.05:0.01 in a high-speed mixer to obtain a mixture I;

S2. the mixture I was subjected to a first high-temperature sintering at 960° C. for 10 h under an air atmosphere, natural cooling to room temperature, and crushing and sieving to obtain a cathode material process product I having a $D_{50}$ of 3.4 μm;

S3. the cathode material process product I was subjected to a second high-temperature sintering at 980° C. for 12 h under an air atmosphere, natural cooling to room temperature, and crushing and sieving to obtain a cathode material process product II having a $D_{50}$ of 3.3 μm, primary particles being independent of each other; wherein the temperature of the second high-temperature sintering is 20° C. higher than the temperature of the first high-temperature sintering;

S4. the cathode material process product II and zirconia were uniformly mixed in a ratio of [n(Ni)+n(Co)+n(Mn)]:n(Zr)=1:0.015 in a high-speed mixer to obtain a mixture II; and S5. the mixture II was subjected to a third high-temperature sintering at 820° C. for 9 h under an air atmosphere, natural cooling to room temperature, and crushing and sieving to obtain a single-crystal multiple cathode material A4. Its composition was $Li_{1.05}(Cr_{0.005}Al_{0.01}Ni_{0.5}Co_{0.2}Mn_{0.3})Zr_{0.015}O_2$. The performance parameters of the cathode material A4 are shown in Table 1.

Example 5

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=95:3:2, a 0.2 mol/L $Y(NO_3)_3$ solution was prepared, a 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(Y)=1:0.012 was controlled, a stirring speed was 200 rpm, the reaction temperature was maintained at 55° C., a pH was 12.3, and the parallel flow time was 28 h, and aging was performed for 20 h to obtain a solid-liquid mixed slurry.

(3) The solid-liquid mixed slurry was subjected to washed, filter pressing, and dried at 120° C. for 6 h to obtain a nickel cobalt manganese hydroxide precursor P5 having a $D_{50}$ of 4 μm, wherein the precursor is spherical or spheroidal single particles, and has a loose structure, an apparent density of 0.71 g/cm³ and a tap density of 1.32 g/cm³.

II: Preparation of Single-Crystal Multiple Cathode Material

S1. The nickel cobalt manganese hydroxide precursor P5, lithium hydroxide and zinc oxide were uniformly mixed in a ratio of [n(Ni)+n(Co)+n(Mn)]:n(Li):n(Zn)=1:1.08:0.014 in a high-speed mixer to obtain a mixture I;

S2. on the mixture I was subjected to a first high-temperature sintering at 700° C. for 5 h under an oxygen atmosphere, natural cooling to room temperature, and crushing and sieving to obtain a cathode material process product I having a $D_{50}$ of 3.9 μm;

S3. the cathode material process product I was subjected to a second high-temperature sintering at 800° C. for 10 h under an oxygen atmosphere, natural cooling to room temperature, and crushing and sieving to obtain a cathode material process product II having a $D_{50}$ of 4

μm, primary particles being independent of each other; wherein the temperature of the second high-temperature sintering is 100° C. higher than the temperature of the first high-temperature sintering;

S4. the cathode material process product II and molybdenum oxide were uniformly mixed in a ratio of [n(Ni)+n(Co)+n(Mn)]:n(Mo)=1:0.008 in a high-speed mixer to obtain a mixture II; and S5. the mixture II was subjected to a third high-temperature sintering at 600° C. for 10 h under an oxygen atmosphere, natural cooling to room temperature, and crushing and sieving to obtain a single-crystal multiple cathode material A5. Its composition was $Li_{1.08}(Y_{0.012}Zn_{0.014}Ni_{0.95}Co_{0.03}Mn_{0.02})Mo_{0.008}O_2$. The performance parameters of the cathode material A5 are shown in Table 1.

Example 6

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=80:10:10, a 8 mol/L NaOH solution was prepared as a precipitant, and 25 wt % ammonia water was used directly as a complexing agent.

(2) Under nitrogen protection, the above solutions were introduced into a reactor in a parallel flow, wherein a stirring speed was 200 rpm, the reaction temperature was maintained at 55° C., a pH was 12.3, and the parallel flow time was 23 h, and aging was performed for 20 h to obtain a solid-liquid mixed slurry.

(3) The solid-liquid mixed slurry was subjected to filter pressing, washed and dried at 120° C. for 5 h to obtain a nickel cobalt manganese hydroxide precursor P6 having a $D_{50}$ of 3.2 μm, wherein the precursor is spherical or spheroidal single particles, and has a loose structure, an apparent density of 0.71 g/cm³ and a tap density of 1.33 g/cm³.

II: Preparation of Single-Crystal Multiple Cathode Material

S1. The nickel cobalt manganese hydroxide precursor P6 and lithium hydroxide were uniformly mixed in a ratio of [n(Ni)+n(Co)+n(Mn)]:n(Li)=1:1.05 in a high-speed mixer to obtain a mixture I;

S2. the mixture I was subjected to a first high-temperature sintering at 850° C. for 8 h under an oxygen atmosphere, natural cooling to room temperature, and crushing and sieving to obtain a cathode material process product I having a $D_{50}$ of 3.1 μm;

S3. the cathode material process product I was subjected to a second high-temperature sintering at 900° C. for 8 h under an oxygen atmosphere, natural cooling to room temperature, and crushing and sieving to obtain a cathode material process product II having a $D_{50}$ of 3.3 μm, primary particles being independent of each other; wherein the temperature of the second high-temperature sintering is 50° C. higher than the temperature of the first high-temperature sintering;

S4. the mixture II was subjected to a third high-temperature sintering at 750° C. for 10 h under an oxygen atmosphere, natural cooling to room temperature, and crushing and sieving to obtain a single-crystal multiple cathode material A6. Its composition was $Li_{1.05}(Ni_{0.8}Co_{0.1}Mn_{0.1})O_2$. The performance parameters of the cathode material A6 are shown in Table 1.

Example 7

A single-crystal multiple cathode material was prepared according to the method in Example 1, except that the temperature of the second high-temperature sintering was kept constant, and the temperature of the first high-temperature sintering was adjusted such that the temperature of the second high-temperature sintering was 130° C. higher than the temperature of the first high-temperature sintering.

A single-crystal multiple cathode material A7 was prepared with the performance parameters shown in Table 1.

Example 8

A single-crystal multiple cathode material was prepared according to the method in Example 1, except that the temperature of the second high-temperature sintering was kept constant, and the temperature of the first high-temperature sintering was adjusted such that the temperature of the second high-temperature sintering was 180° C. higher than the temperature of the first high-temperature sintering.

A single-crystal multiple cathode material A8 was prepared with the performance parameters shown in Table 1.

Example 9

A single-crystal multiple cathode material was prepared according to the method in Example 1, except that the temperature of the second high-temperature sintering was kept constant, and the temperature of the first high-temperature sintering was adjusted such that the temperature of the second high-temperature sintering was 10° C. higher than the temperature of the first high-temperature sintering.

A single-crystal multiple cathode material A9 was prepared with the performance parameters shown in Table 1.

Example 10

A single-crystal multiple cathode material was prepared according to the method in Example 1, except that the temperature of the second high-temperature sintering was kept constant, and the temperature of the first high-temperature sintering was adjusted such that the temperature of the second high-temperature sintering was 400° C. higher than the temperature of the first high-temperature sintering.

A single-crystal multiple cathode material A10 was prepared with the performance parameters shown in Table 1.

Example 11

A single-crystal multiple cathode material was prepared according to the method in Example 1, except that the temperature of the second high-temperature sintering was kept constant, and the temperature of the first high-temperature sintering was adjusted such that the temperature of the second high-temperature sintering was 50° C. lower than the temperature of the first high-temperature sintering.

A single-crystal multiple cathode material A11 was prepared with the performance parameters shown in Table 1.

Example 12

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=80:10:10, a 0.2 mol/L $La_2(SO_4)_3$ solution was prepared, a 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(La)=1:0.05 was controlled, a stirring speed was 200 rpm, the reaction temperature was maintained at 55° C., a pH was 12.3, and the parallel flow time was 23 h, and aging was performed for 20 h to obtain a solid-liquid mixed slurry.

(3) The solid-liquid mixed slurry was subjected to filter pressing, washed and dried at 120° C. for 5 h to obtain a nickel cobalt manganese hydroxide precursor P12 containing a dopant La and having a $D_{50}$ of 3.1 μm, wherein the precursor is spherical or spheroidal single particles, and has a loose structure, an apparent density of 0.72 g/cm$^3$ and a tap density of 1.34 g/cm$^3$.

II: Preparation of Single-Crystal Multiple Cathode Material

S1. The nickel cobalt manganese hydroxide precursor P12, lithium hydroxide, and calcium oxide were uniformly mixed in a ratio of [n(Ni)+n(Co)+n(Mn)]:n(Li):n(Ca)=1:1.1:0.05 in a high-speed mixer to obtain a mixture I;

S2. the mixture I was subjected to a first high-temperature sintering at 700° C. for 8 h under an oxygen atmosphere, natural cooling to room temperature, and crushing and sieving to obtain a cathode material process product I having a $D_{50}$ of 3.2 μm;

S3. the cathode material process product I was subjected to a second high-temperature sintering at 900° C. for 8 h under an oxygen atmosphere, natural cooling to room temperature, and crushing and sieving to obtain a cathode material process product II having a $D_{50}$ of 3.2 μm, primary particles being independent of each other; wherein the temperature of the second high-temperature sintering is 200° C. higher than the temperature of the first high-temperature sintering;

S4. the cathode material process product II and magnesium oxide were uniformly mixed in a ratio of [n(Ni)+n(Co)+n(Mn)]:n(Mg)=1:0.05 in a high-speed mixer to obtain a mixture II; and S5. the mixture II was subjected to a third high-temperature sintering at 800° C. for 10 h under an oxygen atmosphere, natural cooling to room temperature, and crushing and sieving to obtain a single-crystal multiple cathode material A12. Its composition was $Li_{1.1}(La_{0.05}Ca_{0.05}Ni_{0.8}Co_{0.1}Mn_{0.1})Mg_{0.05}O_2$. The performance parameters of the cathode material A12 are shown in Table 1.

Figure 4:
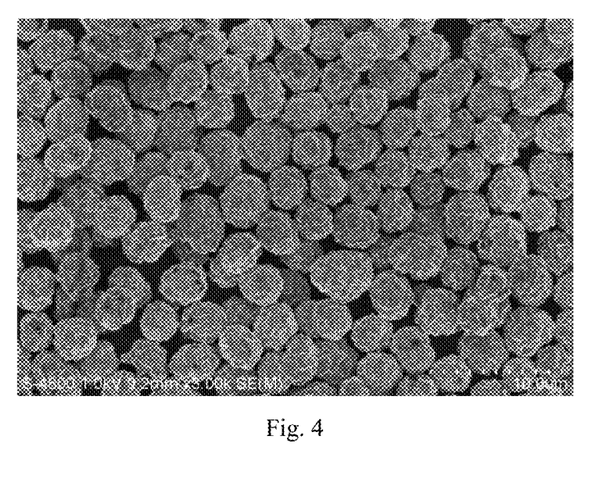
FIG. 4 is a SEM image of a cathode material process product I prepared in Example 12.
Figure 5:
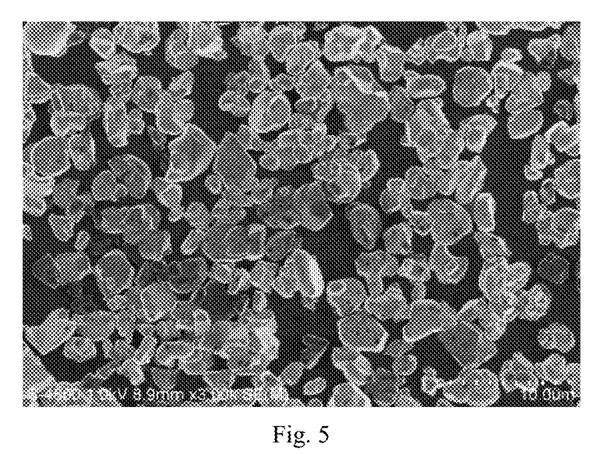
FIG. 5 is a SEM image of a cathode material process product II prepared in Example 12.
Figure 6:
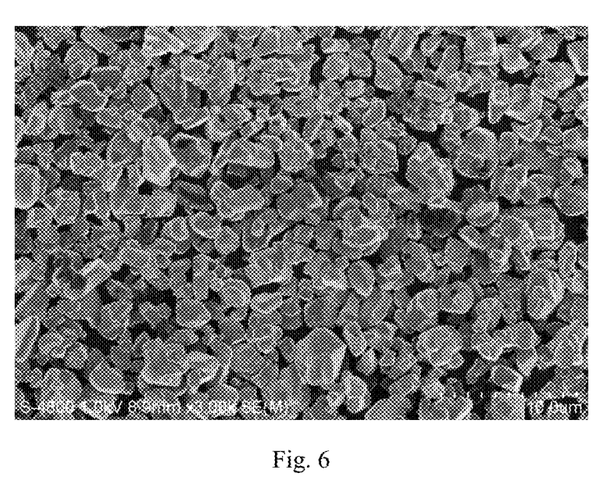
FIG. 6 is a SEM image of a single-crystal multiple cathode material prepared in Example 12.

FIG. 4 is a SEM image of the cathode material process product I prepared in Example 12; and as can be seen from FIG. 4, the cathode material process product I is a multi-crystal compound. FIG. 5 is a SEM image of the cathode material process product II prepared in Example 12; and as can be seen from FIG. 5, the cathode material process product II is a single-crystal compound. FIG. 6 is a SEM image of the single-crystal multiple cathode material A12; and as can be seen from FIG. 6, the cathode material A12 is a single-crystal compound with a surface coating layer.

Comparative Example 1

I: Preparation of Nickel Cobalt Manganese Hydroxide Precursor

A nickel cobalt manganese hydroxide precursor was prepared according to the method in Example 1.

II: Preparation of Single-Crystal Multiple Cathode Material

Figure 7:
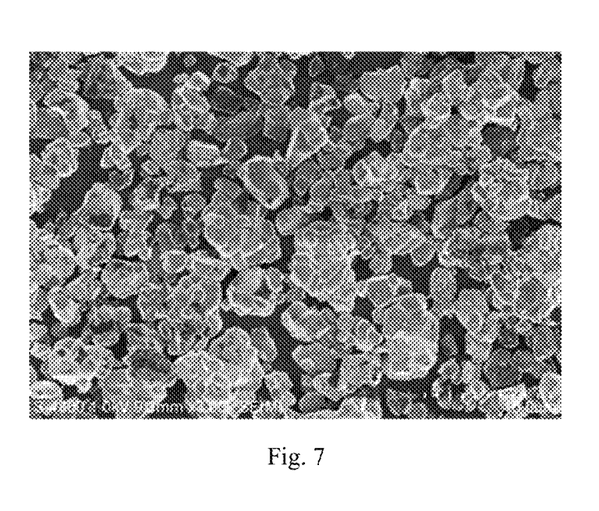
FIG. 7 is a SEM image of a single-crystal multiple cathode material prepared in Comparative example 1.

A single-crystal multiple cathode material was prepared according to the method in Example 1, except that without performing the step S2, the mixture I was directly subjected to a second high-temperature sintering. A single-crystal multiple cathode material D1 was prepared. Its composition was $Li_{1.05}(La_{0.01}Ca_{0.008}Ni_{0.8}Co_{0.1}Mn_{0.1})Mg_{0.012}O_2$. The performance parameters of the cathode material D1 are shown in Table 1. FIG. 7 is a SEM image of the cathode material D1, and it can be seen from FIG. 7 that the material is not uniform in size, has a higher agglomeration rate, and is poorly-single-crystallized.

Comparative Example 2

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=50:20:30, and a 0.2 mol/L $Cr_2(SO_4)_3$ solution was prepared. A 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(Cr)=1:0.01 was controlled, a stirring speed was 200 rpm, the reaction temperature was maintained at 55° C., a pH was 12.3, and the parallel flow time was 23 h, and aging was performed for 20 h to obtain a solid-liquid mixed slurry.

(3) The solid-liquid mixed slurry was subjected to washed, filter pressing, and dried at 100° C. for 5 h to obtain a nickel cobalt manganese hydroxide precursor PD2 having a $D_{50}$ of 4.5 μm, wherein the precursor is spherical or spheroidal single particles, and has a loose structure, an apparent density of 0.72 g/cm$^3$ and a tap density of 1.34 g/cm$^3$.

II: Preparation of Single-Crystal Multiple Cathode Material

S1. The nickel cobalt manganese hydroxide precursor PD2, lithium hydroxide and alumina were uniformly mixed in a ratio of [n(Ni)+n(Co)+n(Mn)]:n(Li):n(Al)=1:1.06:0.01 in a high-speed mixer to obtain a mixture I;

S2. the mixture I was subjected to a second high-temperature sintering at 980° C. for 12 h under an air atmosphere, natural cooling to room temperature, and crushing and sieving to obtain a cathode material process product II having a $D_{50}$ of 3.4 μm;

S3. the cathode material process product II and zirconia were uniformly mixed in a ratio of [n(Ni)+n(Co)+n(Mn)]:n(Zr)=1:0.01 in a high-speed mixer to obtain a mixture II; and S4. the mixture II was subjected to a third high-temperature sintering at 820° C. for 9 h under an air atmosphere, natural cooling to room temperature, and crushing and sieving to obtain a single-crystal multiple cathode material D2. Its composition was $Li_{1.06}(Cr_{0.01}Al_{0.01}Ni_{0.5}Co_{0.2}Mn_{0.3})Zr_{0.01}O_2$. The performance parameters of the cathode material D2 are shown in Table 1.

Comparative Example 3

I: Preparation of Nickel Cobalt Manganese Hydroxide Precursor (1) A 2 mol/L uniform mixed solution of nickel, cobalt and manganese salts was prepared by using nickel sulfate, cobalt sulfate and manganese sulfate as raw materials according to a molar ratio of Ni:Co:Mn=95:3:2, and a 0.2 mol/L $Y(NO_3)_3$ solution was prepared. A 8 mol/L NaOH solution was prepared as a precipitant, and 25 wt % ammonia water was used directly as a complexing agent.

(2) Under nitrogen protection, the above solutions were introduced into a reactor in a parallel flow, wherein [n(Ni)+n(Co)+n(Mn)]:n(Y)=1:0.01 was controlled, a stirring speed was 200 rpm, the reaction temperature was maintained at 55° C., a pH was 12.3, and the parallel flow time was 23 h, and aging was performed for 20 h to obtain a solid-liquid mixed slurry.

(3) The solid-liquid mixed slurry was subjected to washed, filter pressing, and dried at 100° C. for 5 h to obtain a nickel cobalt manganese hydroxide precursor PD3 having a $D_{50}$ of 3.1 µm, wherein the precursor is spherical or spheroidal single particles, and has a loose structure, an apparent density of 0.72 g/cm$^3$ and a tap density of 1.34 g/cm$^3$.

II: Preparation of Single-Crystal Multiple Cathode Material

S1. The nickel cobalt manganese hydroxide precursor PD3, lithium hydroxide and zinc oxide were uniformly mixed in a ratio of [n(Ni)+n(Co)+n(Mn)]:n(Li):n(Zn)=1:1.06:0.01 in a high-speed mixer to obtain a mixture I;

S2. the mixture I was subjected to a second high-temperature sintering at 800° C. for 10 h under an oxygen atmosphere, natural cooling to room temperature, and crushing and sieving to obtain a cathode material process product II having a $D_{50}$ of 3.0 µm;

S3. the cathode material process product II and molybdenum oxide were uniformly mixed in a ratio of [n(Ni)+n(Co)+n(Mn)]:n(Mo)=1:0.01 in a high-speed mixer to obtain a mixture II; and S5. the mixture II was subjected to a third high-temperature sintering at 600° C. for 7 h under an oxygen atmosphere, natural cooling to room temperature, and crushing and sieving to obtain a single-crystal multiple cathode material D3. Its composition was $Li_{1.06}(Y_{0.01}Zn_{0.01}Ni_{0.95}Co_{0.03}Mn_{0.02})Mo_{0.01}O_2$. The performance parameters of the cathode material D3 are shown in Table 1.

Test Example

A button cell was prepared by using the cathode materials in Examples and Comparative examples as a cathode, and a specific preparation method was as follows:

manufacture of the button cell:

first, a nonaqueous electrolyte secondary battery of a composite nickel-cobalt-manganese multiple cathode active material, acetylene black, and polyvinylidene fluoride (PVDF) were mixed in a mass ratio of 95:3:2, an aluminum foil was coated with the obtained mixture, drying was performed, and press forming was performed with a pressure of 100 MPa to obtain a cathode having a diameter of 12 mm and a thickness of 120 µm, and then the electrode was put into a vacuum drying oven for drying at 120° C. for 12 h.

A negative electrode adopted a Li metal sheet having a diameter of 17 mm and a thickness of 1 mm; a separator adopted a polyethylene porous membrane having a thickness of 25 µm; and an electrolyte solution adopted a mixed solution of 1 mol/L $LiPF_6$, ethylene carbonate (EC) and diethyl carbonate (DEC) in equal amounts.

The cathode, the separator, a negative electrode, and the electrolyte solution were assembled into a 2025 type button cell inside an Ar gas glove box having both the water content and the oxygen content of less than 5 ppm, and the cell at this time was used as an unactivated cell.

The electrochemical performance of the button cell was tested and the test results are shown in Table 2.

TABLE 2

| | 0.1 C first discharge specific capacity mAh/g | 1 C discharge specific capacity mAh/g | Capacity retention in 80 cycles at 1 C/1 C@45° C. % |
|---|---|---|---|
| Example 1 | 205.1 | 189.2 | 94.2% |
| Example 2 | 204.8 | 188.6 | 94.0% |
| Example 3 | 205.1 | 189.5 | 94.9% |
| Example 4 | 171.9 | 159.2 | 98.2% |
| Example 5 | 220.3 | 203.0 | 93.6% |
| Example 6 | 204.2 | 185.2 | 90.2% |
| Example 7 | 204.8 | 188.4 | 93.8% |
| Example 8 | 204.5 | 188.1 | 93.4% |
| Example 9 | 203.2 | 186.7 | 92.2% |
| Example 10 | 204.6 | 187.2 | 91.1% |
| Example 11 | 201.5 | 183.8 | 90.2% |
| Example 12 | 204.5 | 187.8 | 89.2% |

TABLE 1

| | Composition | $D_{50}$/µm | $D_{PS50}$/µm | $B_{90}$ | $H_{PS}$ | Agglomeration rate/% | Compaction density/g/cm$^3$ |
|---|---|---|---|---|---|---|---|
| A1 | $Li_{1.05}(La_{0.01}Ca_{0.008}Ni_{0.8}Co_{0.1}Mn_{0.1})Mg_{0.012}O_2$ | 3.32 | 1.89 | 0.75 | 0.28 | 8 | 3.50 |
| A2 | $Li_{1.05}(Ce_{0.015}Sr_{0.012}Ni_{0.8}Co_{0.1}Mn_{0.1})Si_{0.01}O_2$ | 3.11 | 1.82 | 1.02 | 0.30 | 10 | 3.45 |
| A3 | $Li_{1.04}(Er_{0.015}B_{0.009}Ni_{0.8}Co_{0.1}Mn_{0.1})W_{0.01}O_2$ | 3.79 | 2.21 | 0.92 | 0.25 | 5 | 3.55 |
| A4 | $Li_{1.05}(Cr_{0.005}Al_{0.01}Ni_{0.5}Co_{0.2}Mn_{0.3})Zr_{0.015}O_2$ | 3.38 | 2.74 | 1.29 | 0.35 | 16 | 3.42 |
| A5 | $Li_{1.08}(Y_{0.012}Zn_{0.014}Ni_{0.95}Co_{0.03}Mn_{0.02})Mo_{0.008}O_2$ | 4.02 | 1.61 | 1.37 | 0.38 | 17 | 3.41 |
| A6 | $Li_{1.05}(Ni_{0.8}Co_{0.1}Mn_{0.1})O_2$ | 3.52 | 1.39 | 1.11 | 0.32 | 16 | 3.41 |
| A7 | $Li_{1.05}(La_{0.01}Ca_{0.008}Ni_{0.8}Co_{0.1}Mn_{0.1})Mg_{0.012}O_2$ | 3.31 | 1.67 | 1.12 | 0.32 | 15 | 3.40 |
| A8 | $Li_{1.05}(La_{0.01}Ca_{0.008}Ni_{0.8}Co_{0.1}Mn_{0.1})Mg_{0.012}O_2$ | 3.30 | 1.51 | 1.15 | 0.35 | 17 | 3.32 |
| A9 | $Li_{1.05}(La_{0.01}Ca_{0.008}Ni_{0.8}Co_{0.1}Mn_{0.1})Mg_{0.012}O_2$ | 3.35 | 1.53 | 1.22 | 0.42 | 19 | 3.31 |
| A10 | $Li_{1.05}(La_{0.01}Ca_{0.008}Ni_{0.8}Co_{0.1}Mn_{0.1})Mg_{0.012}O_2$ | 3.14 | 1.32 | 1.19 | 0.41 | 20 | 3.31 |
| A11 | $Li_{1.05}(La_{0.01}Ca_{0.008}Ni_{0.8}Co_{0.1}Mn_{0.1})Mg_{0.012}O_2$ | 3.42 | 2.55 | 1.34 | 0.47 | 22 | 3.28 |
| A12 | $Li_{1.1}(La_{0.05}Ca_{0.05}Ni_{0.8}Co_{0.1}Mn_{0.1})Mg_{0.05}O_2$ | 3.25 | 1.44 | 1.16 | 0.37 | 18 | 3.32 |
| D1 | $Li_{1.05}(La_{0.01}Ca_{0.008}Ni_{0.8}Co_{0.1}Mn_{0.1})Mg_{0.012}O_2$ | 3.20 | 1.49 | 1.70 | 0.58 | 26 | 3.26 |
| D2 | $Li_{1.06}(Cr_{0.01}Al_{0.01}Ni_{0.5}Co_{0.2}Mn_{0.3})Zr_{0.01}O_2$ | 3.50 | 1.40 | 1.60 | 0.56 | 32 | 3.32 |
| D3 | $Li_{1.06}(Y_{0.01}Zn_{0.01}Ni_{0.95}Co_{0.03}Mn_{0.02})Mo_{0.01}O_2$ | 3.00 | 1.30 | 1.70 | 0.52 | 40 | 3.35 |

TABLE 2-continued

| | 0.1 C first discharge specific capacity mAh/g | 1 C discharge specific capacity mAh/g | Capacity retention in 80 cycles at 1 C/1 C@45° C. % |
|---|---|---|---|
| Comparative example 1 | 204.8 | 188.1 | 92.6% |
| Comparative example 2 | 170.8 | 157.2 | 89.6% |
| Comparative example 3 | 219.5 | 201.7 | 84.1% |

Figure 8:
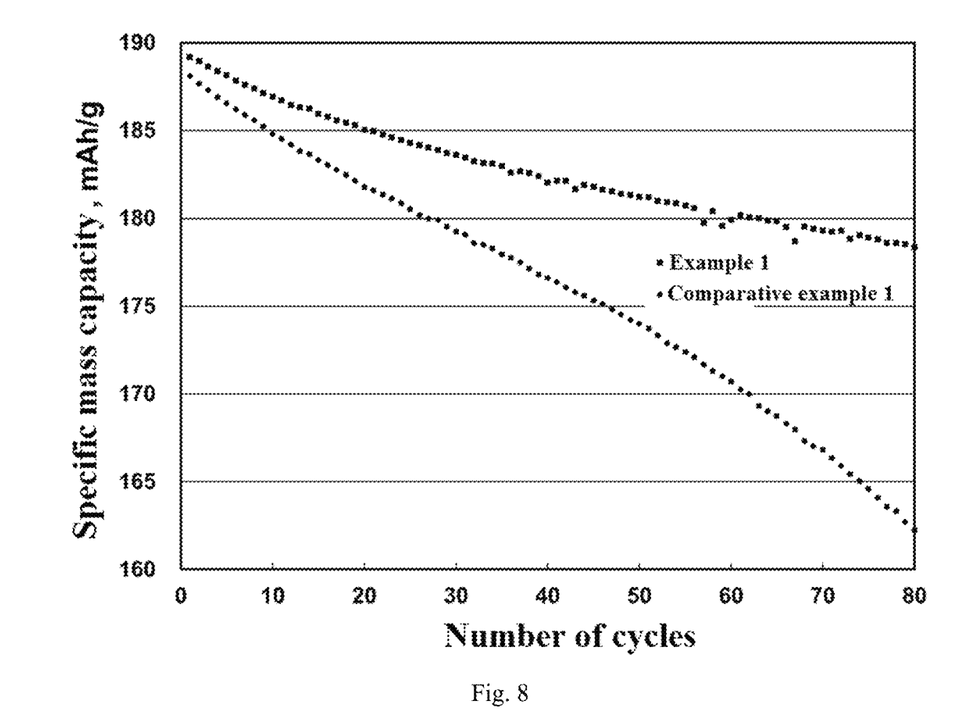
FIG. 8 is a comparison diagram of 80 cycles at 1.0 C/1.0 C@45° C. in Example 1 and Comparative example 1.

FIG. 8 is a comparison diagram of 80 cycles at 1 C/1 C@45° C. in Example 1 and Comparative example 1, and it can be seen from FIG. 8 that the capacity in Example 1 was slightly higher than that in Comparative example 1, the cycle retention in Example 1 was significantly higher than that in Comparative example 1, and as the cycle progressed, the capacity in Example 1 decreased steadily, while in Comparative example 1, the capacity decline trend became faster and obviously increased.

It can be seen from the results of the examples and comparative examples that:

(1) in Examples 1-3, the conditions within the preferred range of the present disclosure were adopted, and as a result, the prepared cathode materials had moderate $D_{PS}$, and smaller $B_{90}$ and $H_{PS}$, indicating that the single-crystal was rounded, the spheroidicity was good, the size was uniform, the agglomeration rate was also low, the capacity was high and the cycle was good.

(2) In Examples 7-12, the conditions within the preferred range of the present disclosure were not adopted, and as a result, the single-crystallization and performance of the prepared cathode materials were slightly worse than those in Examples 1-3, but better than those in Comparative examples 1-3.

(3) In Comparative examples 1-3, the preparation method according to the present disclosure were not adopted, and as a result, the resulting cathode materials have poor performance.

Preferred embodiments of the present disclosure are described above in detail, but the present disclosure is not limited thereto. Within the technical concept range of the present disclosure, the technical solution of the present disclosure can be subjected to various simple variations, including the combination of various technical features in any other suitable manner, and these simple variations and combinations should likewise be considered as the contents disclosed by the present disclosure, and all fall within the protection scope of the present disclosure.

The invention claimed is:

1. A single-crystal multiple cathode material comprising:
   (1) single-crystal sizes $D_{PS90}$, $D_{PS10}$ and $D_{PS50}$ of the single-crystal multiple cathode material, which are measured by SEM, satisfying: $0.92 \leq B_{90} = (D_{PS90} - D_{PS10})/D_{PS50} \leq 1.5$; and
   (2) an agglomeration rate of the single-crystal multiple cathode material being less than or equal to 10%;
   wherein $D_{PS90}$ represents that 90% of the single-crystal size of the single-crystal multiple cathode material is less than $D_{PS90}$; $D_{PS50}$ represents that 50% of the single-crystal size of the cathode material is less than $D_{PS50}$; and $D_{PS10}$ represents that 10% of the single-crystal size of the single-crystal multiple cathode material is less than $D_{PS10}$;
   $D_{PS}$ represents a single-crystal size obtained based on the basis of a scale in an SEM image of the single-crystal multiple cathode material, and $D_{PS}$ of a single particle is an average of a longest diagonal and a shortest diagonal of the particle;
   wherein the single-crystal multiple cathode material has a composition represented by a formula I:

$$Li_{1+a}(A_mD_nNi_xMn_yCo_z)E_iO_2 \qquad \text{Formula I}$$

wherein $-0.1 \leq a \leq 0.1$, $0 \leq m \leq 0.05$, $0 \leq n \leq 0.05$, $0.5 \leq x \leq 1$, $0 \leq y \leq 0.5$, $0 \leq z \leq 0.5$, and $0 \leq i \leq 0.05$; A is selected from at least one of V, Ta, Cr, La, Ce, Er and Y; D is selected from at least one of Mg, Sr, B, V, Al, Ca, Zn, Ba, Ra, Zr and Ti; and E is selected from at least one of Al, Nb, Co, Mn, Mo, W, Si, Mg, Ti and Zr;
   wherein the single-crystal multiple cathode material has an average single-crystal size $D_{PS50}$ of 1-1.89 µm;
   and, the single-crystal multiple cathode material satisfies: $0.28 \leq H_{PS} \leq 0.5$;
   wherein $H_{PS}$ is a statistical average of $H_{PSn}$ of a plurality of grain particles, $H_{PSn}$ is a calculated result of a single particle, $H_{PSn} = 2(D_{PSLn} - D_{PSSn})/(D_{PSLn} + D_{PSSn})$, $D_{PSLn}$ is a longest diagonal length of a single particle n of the single-crystal multiple cathode material, which is measured by SEM, and $D_{PSSn}$ is a shortest diagonal length of a single particle n of the single-crystal multiple cathode material, which is measured by SEM.

2. The single-crystal multiple cathode material according to claim 1, wherein the single-crystal sizes $D_{PS90}$, $D_{PS10}$ and $D_{PS50}$ of the cathode material, which are measured by SEM, satisfy the following relationship: $0.1 \leq B_{90} = (D_{PS90} - D_{PS10})/D_{PS50} \leq 1.3$.

3. The single-crystal multiple cathode material according to claim 1, wherein the single-crystal multiple cathode material has a $D_{50}$ of 2-5 µm.

4. The single-crystal multiple cathode material according to claim 3, wherein the single-crystal multiple cathode material has an average single-crystal size $D_{PS50}$ of 1.2-1.89 µm;
   and/or, the single-crystal multiple cathode material satisfies: $0.28 \leq H_{PS} \leq 0.4$;
   wherein $H_{PS}$ is a statistical average of $H_{PSn}$ of a plurality of grain particles, $H_{PSn}$ is a calculated result of a single particle, $H_{PSn} = 2(D_{PSLn} - D_{PSSn})/(D_{PSLn} + D_{PSSn})$, $D_{PSLn}$ is a longest diagonal length of a single particle n of the single-crystal multiple cathode material, which is measured by SEM, and $D_{PSSn}$ is the shortest diagonal length of a single particle n of the single-crystal multiple cathode material, which is measured by SEM;
   and/or, the cathode material has a $D_{50}$ of 2-4 µm.

5. A method for preparing a single-crystal multiple cathode material according to claim 1 comprising:
   S1. mixing a nickel cobalt manganese hydroxide precursor, a lithium source, and a dopant D to obtain a mixture I;
   S2. subjecting a first high-temperature sintering on the mixture I in an oxygen or air atmosphere to obtain a cathode material process product I;
   S3. subjecting a second high-temperature sintering on the cathode material process product I in an oxygen or air atmosphere to obtain a cathode material process product II;
   S4. mixing the cathode material process product II with optionally a coating agent E to obtain a mixture II; and
   S5. Subjecting a third high-temperature sintering on the mixture II in an oxygen or air atmosphere to obtain the single-crystal multiple cathode material;

in the step S2, the conditions for the first high-temperature sintering comprise a sintering time of 2-8 h;

the temperature of the second high-temperature sintering is 20-100° C. higher than the temperature of the first high-temperature sintering;

the nickel cobalt manganese hydroxide precursor is a hydroxide containing Ni, Co, Mn and a dopant A.

6. The method according to claim 5, wherein in the step S1, the lithium source is selected from at least one of lithium carbonate, lithium nitrate, lithium hydroxide, lithium oxide and lithium acetate;

and/or, the lithium source is added in a stoichiometric ratio of $0.9 \leq [n(Li)]/[n(Ni)+n(Co)+n(Mn)] \leq 1.1$;

and/or, the dopant D is selected from at least one of oxides, oxyhydroxides, hydroxides, carbonates and oxalates containing at least one element of Mg, Sr, B, V, Al, Ca, Zn, Ba, Ra, Zr and Ti;

and/or, the dopant D is added in a stoichiometric ratio of $0 \leq [n(D)]/[n(Ni)+n(Co)+n(Mn)] \leq 0.05$;

and/or, in the step S2, the conditions for the first high-temperature sintering comprise a sintering temperature of 700-1000° C.;

and/or, the cathode material process product I has a $D_{50}$ of 2-5 µm;

and/or, in the step S3, the conditions for the second high-temperature sintering comprise a sintering temperature of 720-1200° C. and a sintering time of 5-20 h;

and/or, the cathode material process product II has a $D_{50}$ of 2-5 µm;

and/or, in the step S4, the coating agent E is selected from at least one of oxides, oxyhydroxides, hydroxides, carbonates and oxalates containing at least one element of Al, Nb, Co, Mn, Mo, W, Si, Mg, Ti and Zr;

and/or, the coating agent E is added in a stoichiometric ratio of $0 \leq [n(E)]/[n(Ni)+n(Co)+n(Mn)] \leq 0.05$;

and/or, in the step S5, the conditions for the third high-temperature sintering comprise a sintering temperature of 500-900° C. and a sintering time of 3-10 h.

7. The method according to claim 5, wherein the nickel cobalt manganese hydroxide precursor is prepared by:

(1) preparing a mixed salt solution of a nickel salt, a cobalt salt, a manganese salt in a molar ratio of Ni:Co:Mn=x:z:y; and preparing a dopant A and a precipitant into a dopant A salt solution and a precipitant solution, respectively;

(2) under a nitrogen atmosphere, adding the mixed salt solution, the precipitant solution, ammonia water and optionally the dopant A salt solution into a reactor, carrying out a continuous reaction and aging to obtain a solid-liquid mixed slurry; and (3) subjecting the solid-liquid mixed slurry to filter pressing, washing, and drying to obtain the nickel cobalt manganese hydroxide precursor.

8. The method according to claim 5, wherein the mixed salt solution has a concentration of 1-3 mol/L; the precipitant solution has a concentration of 5-10 mol/L; and the ammonia water has a mass concentration of 20-30 wt %;

and/or, the dopant A is selected from soluble salts and/or sols containing at least one element of V, Ta, Cr, La, Ce, Er and Y;

and/or, the dopant A is added in a stoichiometric ratio of $0 \leq [n(A)]/[n(Ni)+n(Co)+n(Mn)] \leq 0.05$;

and/or, the conditions for the continuous reaction comprise: a pH of 11-13, a reaction temperature of 40-60° C., and a parallel flow time of 6-30 h;

and/or, the aging includes: an aging temperature of 40-60° C. and an aging time of 5-30 h;

and/or, the nickel cobalt manganese hydroxide precursor containing the dopant A has a $D_{50}$ of 2-6 µm, an apparent density of 0.6-1 g/cm³ and a tap density of 1.2-1.6 g/cm³.

9. A lithium ion battery that includes of the single-crystal multiple cathode material according to claim 1.

10. The single-crystal multiple cathode material according to claim 1 wherein Formula I further requires:

$0 \leq a \leq 0.08$, $0.001 \leq m \leq 0.03$, $0.001 \leq n \leq 0.03$, $0.7 \leq x < 0.9$, $0.1 < y < 0.3$, $0.1 \leq z < 0.3$, and $0.001 \leq i \leq 0.03$.

* * * * *